United States Patent
Hattori

(10) Patent No.: US 8,382,071 B2
(45) Date of Patent: Feb. 26, 2013

(54) RAW MATERIAL SUPPLY DEVICE

(75) Inventor: Nozomu Hattori, Okayama (JP)

(73) Assignee: Mitsui Engineering & Shipbuilding Co., Ltd., Tokyo (JP)

( * ) Notice: Subject to any disclaimer, the term of this patent is extended or adjusted under 35 U.S.C. 154(b) by 347 days.

(21) Appl. No.: 12/921,771

(22) PCT Filed: Feb. 26, 2009

(86) PCT No.: PCT/JP2009/053543
§ 371 (c)(1),
(2), (4) Date: Sep. 9, 2010

(87) PCT Pub. No.: WO2009/113400
PCT Pub. Date: Sep. 17, 2009

(65) Prior Publication Data
US 2011/0000554 A1 Jan. 6, 2011

(30) Foreign Application Priority Data
Mar. 12, 2008 (JP) ................................. 2008-063076

(51) Int. Cl.
*B01F 3/04* (2006.01)
(52) U.S. Cl. ...... 261/44.1; 261/52; 261/64.3; 261/121.1
(58) Field of Classification Search ............... 261/44.1, 261/45, 46, 47, 52, 64.3, 121.1; 137/487.5, 137/565.01
See application file for complete search history.

(56) References Cited

U.S. PATENT DOCUMENTS

| | | | |
|---|---|---|---|
| 3,590,902 A * | 7/1971 | Walker et al. ................. | 164/526 |
| 5,972,117 A * | 10/1999 | Schmitt ......................... | 118/726 |
| 7,562,672 B2 * | 7/2009 | Nakashima et al. .......... | 137/240 |
| 8,016,945 B2 * | 9/2011 | Zilbauer et al. ............... | 118/715 |
| 8,235,364 B2 * | 8/2012 | Sarigiannis et al. ....... | 261/121.1 |
| 2001/0025890 A1 | 10/2001 | Fujimoto et al. | |
| 2005/0235828 A1 | 10/2005 | Ishihara | |

FOREIGN PATENT DOCUMENTS

| | | |
|---|---|---|
| JP | H05-074758 A | 3/1993 |
| JP | H05-251348 A | 9/1993 |
| JP | H10-130845 A | 5/1998 |
| JP | 2006-052424 A | 2/2006 |
| TW | 497168 | 8/2002 |
| TW | 200534911 A | 11/2005 |
| WO | WO 2007/114156 A1 | 10/2007 |

* cited by examiner

*Primary Examiner* — Charles Bushey
(74) *Attorney, Agent, or Firm* — Blakely, Sokoloff, Taylor & Zafman

(57) ABSTRACT

A raw material supply device (105) includes an introduction pipe (152a) which introduces a carrier gas into a raw material vessel (151), a transport pipe (152b) which transports a source gas fed out from the raw material vessel, a supply pipe (155a) which is branched from the transport pipe and supplies the source gas to a film forming chamber (101), a circulation pipe (155b) which is branched from the transport pipe (152b) and returns the source gas to the introduction pipe (152a), an introduction valve (156a) which is attached to the introduction pipe, a supply valve (156b) which is attached to the supply pipe, a circulation valve (156c) which is attached to the circulation pipe, and a controller (157) which controls opening/closing of the valves. The controller controls the supply valve and the circulation valve to be in opposite open/closed states. The source gas can be supplied more stably while suppressing the waste of the raw material.

2 Claims, 2 Drawing Sheets

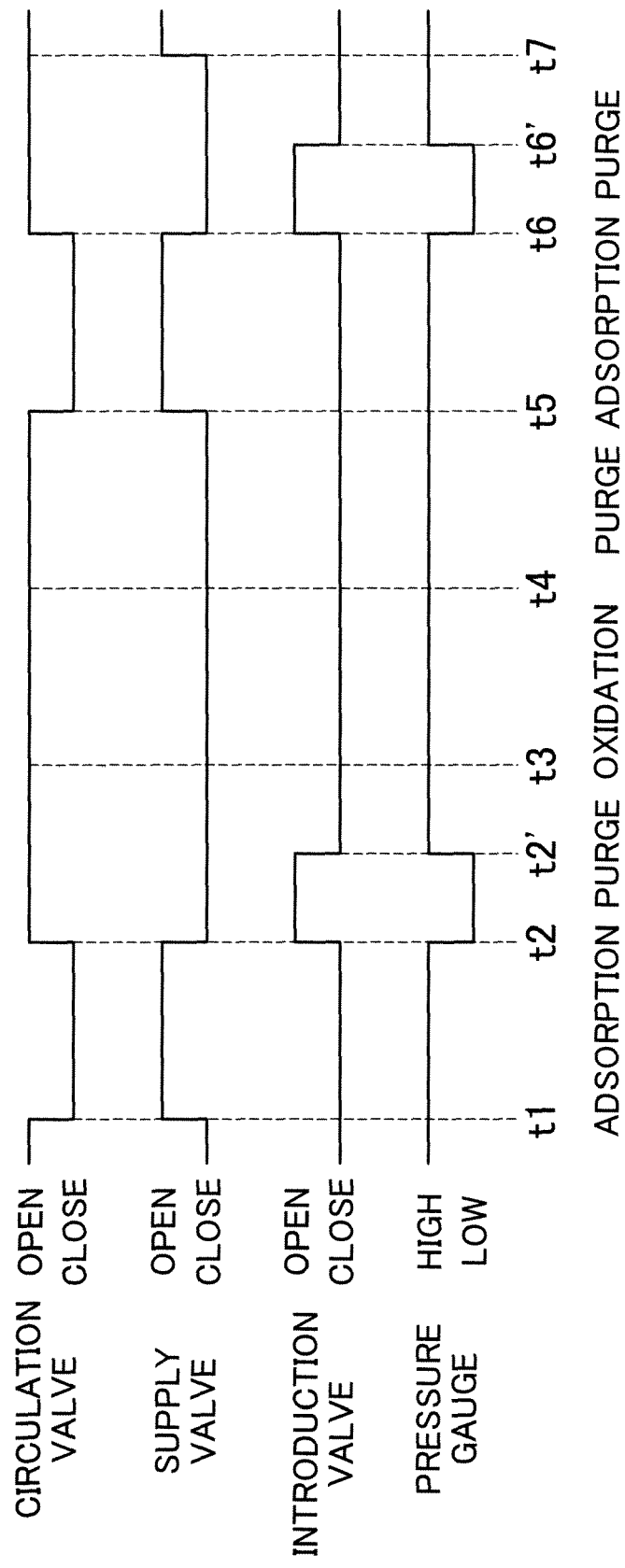

RAW MATERIAL SUPPLY DEVICE

This is a non-provisional application claiming the benefit of International application No. PCT/JP2009/053543 filed Feb. 26, 2009.

TECHNICAL FIELD

The present invention relates to a raw material supply device which supplies a source gas to a thin film forming apparatus for forming a thin film by epitaxial growth.

BACKGROUND ART

Recently, ALD (Atomic Layer Deposition) capable of forming a thin film for each of atomic and molecular layers is receiving attention as a technique having various features including one capable of forming a high-quality thin film more uniformly at a temperature as low as about 300° C. The ALD method is an epitaxial growth technique of forming a thin film for each atomic layer by alternately supplying, to a substrate, the source gases of respective elements which constitute a film to be formed.

In the formation of a thin film using the ALD method, for example, the gas of an organic compound of a metal which constitutes a film to be formed is used as a source gas. Most organic metal compounds are liquids at room temperature (about 20° C.). Thus, an epitaxial growth technique such as ALD evaporates a liquid of an organic metal compound by so-called bubbling and uses it as a source gas (Japanese Patent Laid-Open Nos. 5-074758 and 5-251348). The method of evaporating a liquid raw material by bubbling is a simply raw material supply means for evaporating and supplying a liquid raw material because the structure is simple and a gas used for bubbling can be used as a carrier gas for an evaporated source gas.

DISCLOSURE OF INVENTION

Problems to be Solved by the Invention

The ALD method intermittently supplies a source gas onto a substrate. To implement the intermittent gas supply by bubbling, for example, there is a method of executing bubbling only when supplying gas. However, in the bubbling method, the gas producing state is unstable immediately after the start of bubbling. The amount (concentration) of produced evaporated gas after bubbling continues for some time changes from one immediately after bubbling starts. For the method of repeating the stop and start of bubbling, it is difficult to stably supply a source gas.

In contrast, there is proposed a method of continuing bubbling, and while supplying no source gas, for example, switching the gas path to discard a produced source gas to an exhaust path. This method continues bubbling and thus can stably supply a source gas. However, since the source gas is discarded while the supply of the source gas to a substrate stops, the source gas is wasted, raising the raw material cost.

The present invention has been made to solve the above problems and has as its object to allow supplying a source gas more stably while suppressing the waste of a raw material.

Means of Solution to the Problems

A raw material supply device according to the present invention comprises a raw material vessel which contains a raw material liquid, an introduction pipe which is connected to the raw material vessel, and introduces a carrier gas into the raw material vessel to bubble the raw material liquid, a transport pipe which is connected to the raw material vessel, and transports a source gas that is produced by bubbling and fed out from the raw material vessel, a pump which is attached to the transport pipe and transports the source gas, a supply pipe which is branched from the transport pipe, connected to a supply target, and supplies the source gas to the supply target, a circulation pipe which is branched from the transport pipe and connected to the introduction pipe, an introduction valve which is arranged on a supply side of the carrier gas from a portion of the introduction pipe to which the circulation pipe is connected, a supply valve which is attached to the supply pipe, a circulation valve which is attached to the circulation pipe, and a controller which is connected to the introduction valve, the supply valve, and the circulation valve, and controls opening/closing of the valves, wherein the controller controls at least the supply valve and the circulation valve to be in opposite open/closed states.

EFFECTS OF THE INVENTION

According to the present invention, a supply valve is attached to a supply pipe which is branched from a transport pipe and supplies a source gas to a supply target. A circulation valve is attached to a circulation pipe which is branched from the transport pipe and communicates with an introduction pipe. A controller controls at least the supply valve and circulation valve to be in opposite open/closed states. The source gas can be supplied more stably while suppressing the waste of the raw material.

BRIEF DESCRIPTION OF DRAWINGS

FIG. 2 is a timing chart for explaining an example of the operation of the raw material supply device in the embodiment of the present invention.

BEST MODE FOR CARRYING OUT THE INVENTION

Figure 1:
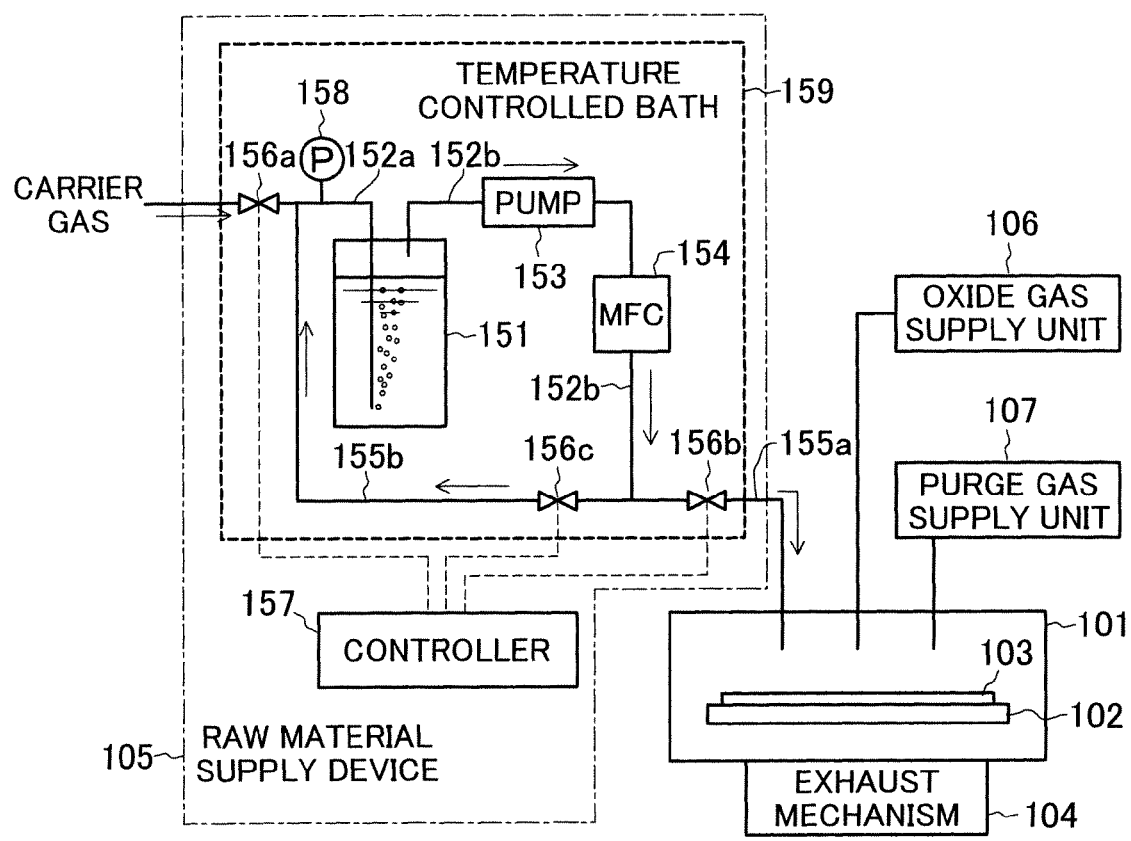
FIG. 1 is a view showing the arrangement of a raw material supply device, and that of a thin film forming apparatus which receives a raw material supplied from the raw material supply device in an embodiment of the present invention.

An embodiment of the present invention will be described with reference to the accompanying drawings. FIG. 1 is a view showing the arrangement of a raw material supply device, and that of a thin film forming apparatus which receives a raw material supplied from the raw material supply device in the embodiment of the present invention. The thin film forming apparatus includes a film forming chamber 101 in which a film is grown by epitaxial growth, a substrate table 102 which is arranged in the film forming chamber 101 and has a heating mechanism, and an exhaust mechanism 104. A raw material supply device 105 can supply a raw material to the thin film forming apparatus. A substrate 103 subjected to thin film formation is set on the substrate table 102. The thin film forming apparatus also includes an oxidizing gas supply unit 106 which supplies an oxidizing gas to the film forming chamber 101, and a purge gas supply unit 107 which supplies, to the film forming chamber 101, a purge gas consisting of an inert gas such as nitrogen gas or argon (Ar) gas. The thin film forming apparatus is, for example, an atomic layer deposition apparatus.

The raw material supply device 105 includes a raw material vessel 151, introduction pipe 152a, transport pipe 152b, pump 153, and massflow controller (MFC) 154. The raw material vessel 151 contains a liquid raw material. The introduction pipe 152a is connected to the raw material vessel 151, and introduces a carrier gas into the raw material vessel 151. The transport pipe 152b is connected to the raw material vessel 151, and transports a source gas produced in the raw material vessel 151, together with the carrier gas. The pump 153 is attached to the transport pipe 152b, and transports the source gas and carrier gas. The MFC 154 controls the flow rates of the source gas and carrier gas transported by the pump 153. Although not shown, a carrier gas supply unit such as a cylinder containing the compressed carrier gas is connected to the introduction pipe 152a.

The raw material supply device 105 also includes a supply pipe 155a, circulation pipe 155b, introduction valve 156a, supply valve 156b, circulation valve 156c, controller 157, and pressure gauge 158. The supply pipe 155a is branched from the transport pipe 152b, connected to the film forming chamber (supply target) 101, and supplies the source gas and carrier gas to the film forming chamber 101. The circulation pipe 155b is branched from the transport pipe 152b, connected to the introduction pipe 152a, and returns the source gas and carrier gas to the introduction pipe 152a (raw material vessel 151). The introduction valve 156a is attached to the introduction pipe 152a. The supply valve 156b is attached to the supply pipe 155a. The circulation valve 156c is attached to the circulation pipe 155b. The controller 157 is connected to the introduction valve 156a, supply valve 156b, and circulation valve 156c, and controls opening/closing of the valves 156a to 156c. The pressure gauge 158 is connected to the introduction pipe 152a. The introduction valve 156a is arranged on the carrier gas supply side from a portion of the introduction pipe 152a to which the circulation pipe 155b is connected. These portions are contained in a temperature controlled bath 159 and can be heated to (kept at) predetermined temperatures. Keeping predetermined temperatures can suppress liquefaction of a source gas in a pipe such as the circulation pipe 155b.

In the raw material vessel 151, an introduction pipe (bubble gas introduction port) communicating with the introduction pipe 152a is arranged deep in a raw material liquid contained in the raw material vessel 151, and can introduce a carrier gas into the raw material liquid (bubbling). The carrier gas is an inert gas such as nitrogen gas or Ar gas. The feed-out port of the transport pipe 152b is arranged in a space above the raw material liquid level in the raw material vessel 151 so as to be able to feed out the evaporated gas of the raw material liquid that is obtained by bubbling.

The source gas and carrier gas whose flow rates are controlled by the MFC 154 after they are fed out from the raw material vessel 151 and transported by the pump 153 are guided to either the supply pipe 155a or circulation pipe 155b by opening/closing control of the supply valve 156b and circulation valve 156c by the controller 157. For example, when the supply valve 156b is opened and the circulation valve 156c is closed, the source gas and carrier gas flowing through the transport pipe 152b are guided to the supply pipe 155a and supplied to the film forming chamber 101. When the circulation valve 156c is opened and the supply valve 156b is closed, the source gas and carrier gas flowing through the transport pipe 152b are guided to the circulation pipe 155b and returned to the introduction pipe 152a.

The carrier gas is supplied to the introduction pipe 152a via the introduction valve 156a. The controller 157 controls opening/closing of the introduction valve 156a in accordance with the internal pressure value of the introduction pipe 152a that is measured by the pressure gauge 158. For example, the controller 157 holds set pressure values in advance. When a pressure value measured by the pressure gauge 158 becomes smaller than the lower limit of the set pressure value, the controller 157 controls to open the introduction valve 156a, introducing the carrier gas into the introduction pipe 152a. When a pressure value measured by the pressure gauge 158 becomes larger than the upper limit of the set pressure value, the controller 157 controls to close the introduction valve 156a, stopping the introduction of the carrier gas into the introduction pipe 152a.

An example of control of each valve by the controller 157 and an example of a source gas supply operation will be explained with reference to the arrangement view of FIG. 1 and the timing chart of FIG. 2. In the initial stage, the internal pressure of the introduction pipe 152a has not reached the upper limit of the set pressure value, and thin film formation in the thin film forming apparatus has not started. In this state, the controller 157 controls to close the supply valve 156b and open the introduction valve 156a and circulation valve 156c. The pump 153 transports a gas in the transport pipe 152b from the raw material vessel 151 to the MFC 154.

Accordingly, the carrier gas is supplied to the introduction pipe 152a, and introduced into the raw material liquid contained in the raw material vessel 151, bubbling the raw material liquid and producing its evaporated gas. The evaporated gas produced in the raw material vessel 151 is fed out from the raw material vessel 151 and transported through the transport pipe 152b by the pump 153. The MFC 154 controls the flow rate of the evaporated gas, and the evaporated gas returns to the introduction pipe 152a via the circulation pipe 155b.

After that, the internal pressure of the introduction pipe 152a reaches the upper limit of the set pressure value, and the pressure gauge 158 detects it. Then, the controller 157 closes the introduction valve 156a, stopping the supply of the carrier gas to the introduction pipe 152a. As a result, the system of the introduction pipe 152a, raw material vessel 151, transport pipe 152b, and circulation pipe 155b shifts to a closed circulation state. In the closed system, the gas transportation by the pump 153 continues. In the raw material vessel 151, the bubbling of the contained raw material liquid by the carrier gas from the bubble gas introduction port of the introduction pipe 152a continues. In this way, the source gas produced in the raw material vessel 151 circulates through the system together with the carrier gas.

As described above, after the system shifts to the circulation state, the controller 157 closes the circulation pipe 155b and opens the supply pipe 155a at time t1 when the adsorption step by the ALD method starts. Under this control, the source gas and carrier gas whose flow rates are controlled by the MFC 154 after they are transported by the pump 153 are transported through the supply pipe 155a and introduced into the film forming chamber 101. The source gas introduced into the film forming chamber 101 is supplied onto the substrate 103 which is heated to a predetermined temperature by the substrate table 102. The source gas is adsorbed by the surface of the substrate 103, forming an adsorption layer corresponding to a one-molecular layer from the raw material on the surface of the substrate 103.

At time t2 when the adsorption step ends and the purge step starts, the controller 157 controls to close the supply valve 156b and open the circulation valve 156c. As a result, the system shifts to the above-described circulation state in the raw material supply device 105. In the raw material vessel 151, the bubbling of the contained raw material liquid by the carrier gas from the bubble gas introduction port of the introduction pipe 152a continues. The source gas produced in the raw material vessel 151 circulates through the system together with the carrier gas.

At this time, for example, if the internal pressure of the introduction pipe 152a decreases to be equal to or lower than the lower limit of the set pressure value owing to the supply of the source gas to the film forming chamber 101 and the pressure gauge 158 detects it, the controller 157 opens the introduction valve 156a, introducing the carrier gas into the introduction pipe 152a. Also in this state, the bubbling of the contained raw material liquid by the carrier gas continues in the raw material vessel 151. At time t2' during the purge step, if the internal pressure of the introduction pipe 152a reaches the upper limit of the set pressure value and the pressure gauge 158 detects it, the controller 157 closes the introduction valve 156a. In response to this, the supply of the carrier gas to the introduction pipe 152a stops, and the system shifts to the foregoing circulation state.

In the purge step, the purge gas supply unit 107 introduces a purge gas such as nitrogen gas or Ar gas into the film forming chamber 101. In addition, the exhaust mechanism 104 exhausts the internal gas (source gas) from the film forming chamber 101.

When the purge step ends and the oxidation step starts at time t3, the circulation state continues till time t5 when a subsequence purge step ends and the next adsorption step starts after the oxidation state ends at time t4. In the oxidation step, the supply of the purge gas from the purge gas supply unit 107 stops, and the oxidizing gas supply unit 106 supplies an oxidizing gas. By supplying the oxidizing gas, the adsorption layer corresponding to a one-molecular layer that is formed on the substrate 103 is oxidized, forming an oxide layer corresponding to a one-molecular layer. In the purge step which starts at time t4, the purge gas supply unit 107 introduces the purge gas such as nitrogen gas or Ar gas into the film forming chamber 101. In addition, the exhaust mechanism 104 exhausts the internal gas (oxidizing gas) from the film forming chamber 101.

When the purge step ends and the next adsorption step starts at time t5, the controller 157 closes the circulation pipe 155b and opens the supply pipe 155a in the above-described manner. Under this control, the source gas and carrier gas whose flow rates are controlled by the MFC 154 after they are transported by the pump 153 are transported through the supply pipe 155a and introduced into the film forming chamber 101. The source gas introduced into the film forming chamber 101 is supplied onto the substrate 103, and adsorbed by the surface of the oxide layer formed on the substrate 103, forming an adsorption layer corresponding to a one-molecular layer from the raw material on the surface of the oxide layer.

At time t6 when the adsorption step ends and the purge step starts, the controller 157 controls to close the supply valve 156b and open the circulation valve 156c. In this purge step, the purge gas supply unit 107 introduces the purge gas such as nitrogen gas or Ar gas into the film forming chamber 101. In addition, the exhaust mechanism 104 exhausts the internal gas (source gas) from the film forming chamber 101.

At this time, as described above, if the internal pressure of the introduction pipe 152a decreases to be equal to or lower than the lower limit of the set pressure value owing to the supply of the source gas to the film forming chamber 101 and the pressure gauge 158 detects it, the controller 157 controls to open the introduction valve 156a, introducing the carrier gas into the introduction pipe 152a. At time t6' during the purge step, if the internal pressure of the introduction pipe 152a reaches the upper limit of the set pressure value and the pressure gauge 158 detects it, the controller 157 controls to close the introduction valve 156a. Accordingly, the supply of the carrier gas to the introduction pipe 152a stops, and the system shifts to the circulation state.

This well-known ALD cycle of adsorption, purge, oxidation, and purge is repeated, forming, on the substrate 103, a desired thin film made of, for example, the oxide of a metal that constitutes the raw material. In the above description, the introduction valve 156a is opened to supply the carrier gas to the introduction pipe 152a at the end of the adsorption step, but the present invention is not limited to this. For example, if the pressure gauge 158 detects that the internal pressure of the introduction pipe 152a decreases to be lower than the lower limit of the set pressure value while supplying the source gas to the film forming chamber 101 in the adsorption step, the controller 157 may control to open the introduction valve 156a and supply the carrier gas to the introduction pipe 152a.

As described above, according to the embodiment, the controller 157 controls the supply valve 156b and circulation valve 156c to be in opposite open/closed states. Even when no source gas is supplied to the film forming chamber 101, the bubbling of the contained raw material liquid by the carrier gas continues in the raw material vessel 151, keeping producing the source gas. Further, the produced source gas is not wasted because it circulates from the introduction pipe 152a again to it via the circulation pipe 155b by the transportation operation of the pump 153.

The invention claimed is:

1. A raw material supply device comprising:
   a raw material vessel which contains a raw material liquid;
   an introduction pipe which is connected to said raw material vessel, and introduces a carrier gas into said raw material vessel to bubble the raw material liquid;
   a transport pipe which is connected to said raw material vessel, and transports a source gas that is produced by bubbling and fed out from said raw material vessel;
   a pump which is attached to said transport pipe and transports the source gas;
   a supply pipe which is branched from said transport pipe, connected to a supply target, and supplies the source gas to the supply target;
   a circulation pipe which is branched from said transport pipe and connected to said introduction pipe;
   an introduction valve which is arranged on a supply side of the carrier gas from a portion of said introduction pipe to which said circulation pipe is connected;
   a supply valve which is attached to said supply pipe;
   a circulation valve which is attached to said circulation pipe; and
   a controller which is connected to said introduction valve, said supply valve, and said circulation valve, and controls opening/closing of said valves,
   wherein said controller controls at least said supply valve and said circulation valve to be in opposite open/closed states.

2. A raw material supply device according to claim 1, further comprising a pressure gauge which measures an internal pressure of said introduction pipe between said introduction valve and said raw material vessel,
   wherein said controller controls to open/close said introduction valve in accordance with a measurement result of said pressure gauge.

* * * * *